US005500249A

United States Patent [19]
Telford et al.

[11] Patent Number: 5,500,249
[45] Date of Patent: Mar. 19, 1996

[54] UNIFORM TUNGSTEN SILICIDE FILMS PRODUCED BY CHEMICAL VAPOR DEPOSITION

[75] Inventors: Susan G. Telford, Cupertino; Meng C. Tseng, Saratoga, both of Calif.; Michio Aruga, Chiba, Japan

[73] Assignee: Applied Materials, Inc., Santa Clara, Calif.

[21] Appl. No.: 64,328

[22] Filed: May 18, 1993

Related U.S. Application Data

[63] Continuation-in-part of Ser. No. 995,211, Dec. 22, 1992.

[30]    Foreign Application Priority Data

Apr. 2, 1993  [JP]  Japan ..................... 5-76894

[51] Int. Cl.⁶ .................................. C23C 16/00
[52] U.S. Cl. .................. 427/255; 427/255.1; 427/255.2; 437/200; 178/DIG. 19; 178/DIG. 27
[58] Field of Search ................................ 427/255.2, 255, 427/255.1; 437/200; 148/DIG. 19, DIG. 27

[56]             References Cited

U.S. PATENT DOCUMENTS

| | | | |
|---|---|---|---|
| 4,391,846 | 7/1983 | Raymond | 427/99 |
| 4,692,343 | 9/1987 | Price et al. | 437/38 |
| 4,737,474 | 4/1988 | Price et al. | 437/200 |
| 4,966,869 | 10/1990 | Hillman et al. | 427/200 |
| 5,183,510 | 2/1993 | Kimura | 118/719 |
| 5,203,956 | 4/1993 | Hansen | 156/643 |

OTHER PUBLICATIONS

Wu et al., "Properties of WSix using dichlorosilane in a single wafer system", J. Vac. Sci. Tech B6(6) Nov./Dec. 1988.
Schuegraf, K., ed., "Handbook of Thin Film Deposition Processes & Techniques", 1988, (pp. 254–256).
Wu, T. H., and Rosler, R. S., "Properties of $WSi_x$ Using Dichlorosilane in a Single–Water System," J. Vac. Sci. Technol. B 6(6), Nov./Dec. 1988, pp. 1707–1713.
Tsai, M. Y., et al., "Properties of Tungsten Silicide Film on Polycrystalline Silicon," J. Appl. Phys. 52(8), Aug. 1981, pp. 5350–5355.
Washidzu, G., et al., "*In Situ* Stress Measurement of Chemical Vapor Deposited Tungsten Silicides," Appl. Phys. Lett. 58(13), Apr. 1991, pp. 1425–1427.
Wright, P. J., and Saraswat, K. C., "The Effect of Fluorine in Silicon Dioxide Gate Dielectrics," IEEE Transactions on Electron Devices, vol. 36, No. 5, May 1989, pp. 879–889.
Shioya, Y., et al., "Effect of Fluorine in Chemical–Vapor–Deposited Tungsten Silicide Film on Electrical Breakdown of $SiO_2$ Film," J. Appl. Phys. 61(11), Jun. 1987, pp. 5102–5109.
Shioya, Y., et al., "High–Temperature Stress Measurement on Chemical–Vapor–Deposited Tungsten Silicide and Tungsten Films," J. Appl. Phys. 61(2), Jan. 1987, pp. 561–566.
Srinivas, D., and Raupp, G. B., "Kinetics of Low Pressure Chemical Vapor Deposition of Tungsten Silicide from Dichlorosilane Reduction of Tungsten Hexafluoride," Mat. Res. Soc. Symp. Proc. VLSI V. (1990), pp. 407–413 no month.
Saraswat, K. C., et al., "Properties of Low–Pressure CVD Tungsten Silicide for MOS VLSI Interconnections," IEEE Transactions on Electron Devices, vol. Ed–30, No. 11, Nov. 1983, pp. 1497–1505.

(List continued on next page.)

*Primary Examiner*—Shrive Beck
*Assistant Examiner*—David M. Maiorana
*Attorney, Agent, or Firm*—Ashok K. Janah

[57]             ABSTRACT

A tungsten silicide film is deposited from $WF_6$ and $SiCl_2H_2$ onto a substrate so that the tungsten to silicon ratio is substantially uniform through the thickness of the $WSi_x$ film, and the $WSi_x$ film is substantially free of fluorine. The film can be deposited by a multi-stage process where the pressure in the chamber is varied, or by a high temperature, high pressure deposition process in a plasma cleaned deposition chamber. Preferably the $SiCl_2H_2$ and the $WF_6$ are mixed upstream of the deposition chamber. A seeding gas can be added to the process gases.

11 Claims, 8 Drawing Sheets

OTHER PUBLICATIONS

Selbrede, S. C., "CVD of Tungsten Silicide Using Dichlorosilane," Semiconductor International, Aug. 1988, pp. 88–92.

Shioya, Y., and Maeda, Mamoru, "Analysis of the Effects of Annealing on Resistivity of Chemical Vapor Deposition Tungsten–Silicide Films," J. Appl. Phys. 60(1), Jul. 1986, pp. 327–333.

Joshi, R. V., et al., "High Growth Rate CVD–W Process for Filling High Aspect Ratio Sub–Micron Contacts/Lines," Mat. Res. Soc. Symp. Proc. VLSI V. (1990), pp. 157–166 no month.

Raupp, G. G., et al., "Step Coverage of Tungsten Silicide Films Deposited by Low Pressure Dichlorosilane Reduction of Tungsten Hexafluoride," Thin Solid Films, 193/194 (1990), pp. 234–243 no month.

Sadana, D. K., "Annealing and Oxidation Behavior of Low–Pressure Chemical Vapor Deposited Tungsten Silicide Layers on Polycrystalline Silicon Gates," J. Appl. Phys. 62(7), Oct. 1987, pp. 2830–2835.

Hara, T., et al., "Composition of CVD Tungsten Silicides," J. Electrochem. Soc., Solid State Science and Technology, May 1987, pp. 1302–1306.

Hara, T., et al., "Deposition of Tungsten Silicide Films by the Chemical Vapor Reaction of Dichlorosilane and Tungsten Hexafluoride," Japanese Journal of Applied Physics, vol. 27, No. 10, Oct. 1988, pp. L1812–L1814.

Hara, T., et al., "Tungsten Silicide Films Deposited by $SiH_2Cl_2$–$WF_6$ Chemical Reaction," J. Electrochem. Soc., vol. 136, No. 4, Apr. 1989, pp. 1177–1179.

Clark, T. E., et al., "High Pressure Blanket CVD Tungsten," Mat. Res. Soc. Symp. Proc. VLSI V. (1990), pp. 167–178 no month.

d'Heurle, F. M., et al., "Observations on the Hexagonal Form of $MoSi_2$ and $WSi_2$ Films Produced by Ion Implantation and on Related Snowplow Effects," J. Appl. Phys. 51(11), Nov. 1980, pp. 5976–5980.

Hara, T., et al., "Surface Reaction of Tungsten Silicide Deposition Using Dichlorosilane Reduction of Tungsten Hexafluoride," Mat. Res. Soc. Symp. Proc. VLSI V. (1990), pp. 399–405 no month.

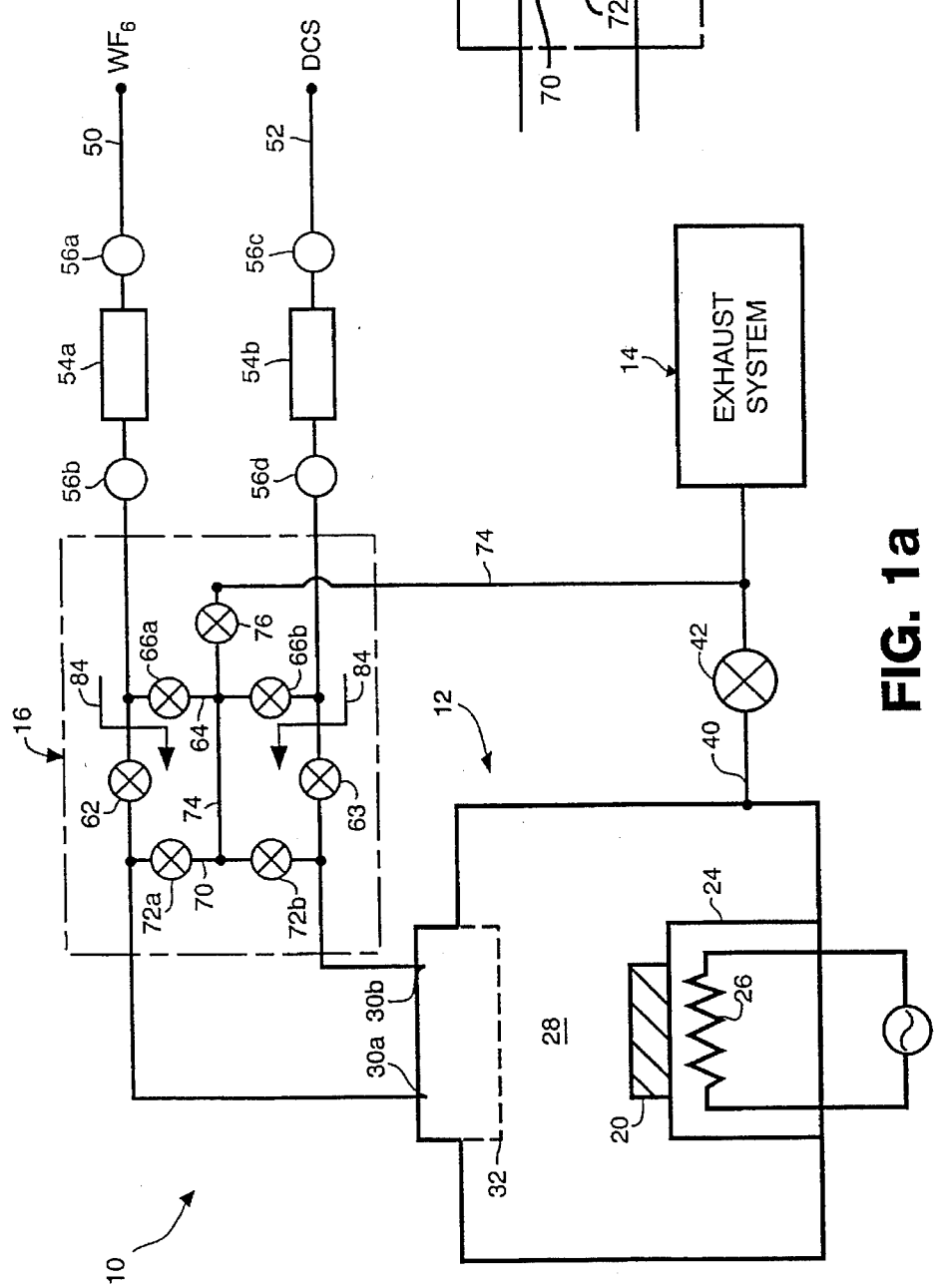
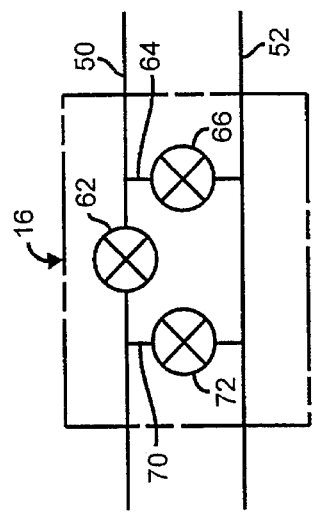
FIG. 1a
FIG. 1b

UNIFORM TUNGSTEN SILICIDE FILMS PRODUCED BY CHEMICAL VAPOR DEPOSITION

CROSS-REFERENCE

This application is a Continuation-in-Part of U.S. patent application Ser. No. 07/995,211, filed on Dec. 22, 1992.

BACKGROUND

This invention relates to the deposition of tungsten-silicide ($WSi_x$) films.

Refractory metal silicide films, such as tungsten silicide, are used in the manufacture of semiconductor integrated circuits such as schottky barriers, ohmic contacts and gate metallizations. Traditionally, polysilicon layers were used for these semiconductor circuits. However, advances in integrated circuit technology led to a scaling down of device dimensions, and an increase in chip size and complexity. Higher complexity chips such as VLSI's (very large-scale integrated circuits), require closely spaced inter-connection lines with smaller cross-sectional areas than conventional integrated circuits. The small cross-sectional area of the interconnection lines results in generation of more resistive heat. Close spacing results in less heat dissipation. This combination of more resistive heat generation and less heat dissipation can cause high temperatures which can result in part failure. Also, the higher resistivity increases the RC time constant which affects the delay time of the circuit. Low delay times are desirable for high speed circuits.

To overcome this problem, refractory metal silicides films having lower resistivities than polysilicon films were developed for use in these improved integrated circuits to obtain lower delay times and so that less heat is generated within the circuit. For gate metallizations, a low resistivity tungsten silicide film is deposited on top of a layer of polycrystalline silicon (polysilicon), to form a layered structure called a "polycide" structure.

At first, tungsten silicide films were deposited by physical vapor deposition techniques such as sputtering and electron-beam evaporation. However, these techniques gave films with poor conformal coverage over the steps and trenches of the polysilicon layer and non-uniform stoichiometry. Alternative deposition techniques such as low pressure chemical vapor deposition (LPCVD) were developed, and provided metallic silicide films with superior conformal coverage and superior properties.

Initially LPCVD processes for the deposition of tungsten silicide ($WSi_x$) films were based on the reduction of tungsten hexa-fluoride ($WF_6$) by monosilane ($SiH_4$). However, $WSi_x$ films produced using monosilane contained high levels of fluorine (often greater than $10^{20}$ fluorine atoms/cc). The high levels of fluorine led to degradation of these films due to migration of the fluorine atoms at operating temperatures. In addition, these films suffered from lower step-coverage and post-annealing problems which can lead to cracking and delamination of the tungsten-silicide layer.

Problems created by the silane chemistry can be avoided by using dichlorosilane (DCS), $SiH_2Cl_2$, instead of monosilane. Tungsten-silicide films produced from the reduction of $WF_6$ by DCS exhibit lower fluorine content, improved step coverage and stronger adhesion.

However, in spite of these encouraging results, the DCS/$WF_6$ process has not been extensively adopted by the semiconductor industry because there are additional problems with these technologies.

First, these processes can fail to produce $WSi_x$ films with a uniform tungsten to silicon ratio through the thickness of the film. In the strata deposited in the initial stages of deposition (which later becomes the "interfacial layer" between the $WSi_x$ film being deposited and the substrate), the films deposited from current methods generally exhibit a value of "x" that is below the optimal range of 2.0 to 2.8. This phenomena is especially true for $WSi_x$ layers deposited on polysilicon. Values of x smaller than 2 (x=2 corresponds to the stoichiometry of the stable tungsten silicide, $WSi_2$) in this interfacial strata are undesirable. The formation of an interfacial tungsten-rich strata can result in delamination of the $WSi_x$ layer during annealing of the fully processed wafer in the final stages of processing. Voids created by the migration of Si ions from the Si rich polysilicon layer to the Si deficient $WSi_x$ layer can also lead to poorer performance.

It is difficult to non-destructively detect formation of the tungsten-rich layer during the initial steps in the process of fabricating the integrated circuit chip. It is only in the final stages of the manufacturing process, when the fully processed wafers are worth between $50,000 to $100,000 each, that the delamination is discovered, and the entire wafer must be scrapped. This expense limits the use of current DCS/$WF_6$ processes on an industrial scale.

Another problem associated with use of current DCS/$WF_6$ processes arises from the nucleation of silicon containing particles in the dichlorosilane gas phase. These particles accumulate and deposit on the walls of the deposition chamber. These deposits eventually fragment and generate particles which contaminate the wafer.

LPCVD equipment is typically sophisticated and expensive. Thus, new processes requiring substantial modification to existing equipment are avoided due to the high costs associated with such modifications. Accordingly, processes that can be implemented on conventional CVD equipment are highly desirable.

Therefore, there is a need for $WSi_x$ films having substantially uniform tungsten to silicon ratios through the thickness of the film and having low concentrations of fluorine. There is also a need for methods to deposit such films, and it is also desirable to be able to use conventional CVD equipment to deposit such films.

SUMMARY

The present invention provides $WSi_x$ films and methods for their manufacture that satisfy the above needs. The $WSi_x$ films prepared in accordance with the present invention have a high degree of uniformity through the thickness of the film, a low concentration of fluorine and other impurities within the film, and can be deposited using conventional CVD equipment.

The present invention is directed to a $WSi_x$ layer on a substrate, where the value of x in the layer is substantially uniform through the thickness of the $WSi_x$ layer, and the $WSi_x$ layer contains less than $10^{18}$ fluorine atoms/cc, and more preferably less than $10^{17}$ fluorine atoms/cc. The layer of $WSi_x$ is at least 300Å thick. By "substantially uniform" it is meant that the average value of x within each strata of the $WSi_x$ layer is between ±10% of the average bulk value of x through the thickness of the $WSi_x$ layer. Typically, the bulk value of x is from about 2.0 to about 2.8, and preferably the value of x is from about 2.2 to about 2.6. The $WSi_x$ layer can be deposited on top of a layer of polycrystalline silicon, an $SiO_2$ layer, or directly on top of a semiconductor wafer, such as a silicon or gallium arsenide wafer.

The WSi$_x$ film is deposited using chemical vapor deposition (CVD) processes. In a multi-stage pressure version of the process, the film can be deposited by:

(a) placing a substrate within a deposition zone;

(b) during a first stage, (i) introducing a first process gas comprising dichlorosilane and tungsten hexa-fluoride into the deposition zone, (ii) maintaining the pressure in the deposition zone at a first higher pressure of at least 1 Torr, and (iii) heating the substrate sufficiently high to deposit WSi$_x$ on the substrate; and (c) during a second stage, (i) introducing a second process gas comprising dichlorosilane and tungsten hexa-fluoride into the deposition zone, (ii) maintaining the pressure in the deposition zone at a second lower pressure of at least 0.5 Torr, the second lower pressure being at least 0.5 Torr less than the first higher pressure, so that x is substantially uniform through the thickness of the WSi$_x$ layer, and (iii) continuing to heat the substrate to a sufficiently high temperature to deposit WSi$_x$ on the substrate.

Alternatively, a single-stage pressure version of the invention can be used. In this process, the pressure is maintained at at least 1 Torr, and the substrate is heated to a temperature of at least 550° C.

When using the single-stage version of the invention, it is preferred to clean and condition the deposition chamber prior to deposition of the WSi$_x$ film. A preferred cleaning process comprises the steps of:

(a) introducing a cleaning gas comprising NF$_3$ into the deposition zone;

(b) generating a plasma in the deposition chamber to cause the NF$_3$ to react with silicon containing compounds on the walls of the deposition chamber enclosing the deposition zone to form gaseous silicon-fluoride compounds;

(c) removing the gaseous silicon-fluoride compounds from the deposition zone, thereby substantially cleansing the zone of silicon containing deposits;

(d) passivating residual fluorine in the zone; and (e) removing the passivated fluorine from the zone.

With both versions of the invention, preferably the process gases are combined upstream of the deposition zone, before their introduction into the deposition zone, so that the process gas is substantially uniform when introduced into the deposition zone.

In any of the above-described versions, a seeding gas, such as SiH$_4$ or H$_2$, can be used for initiating deposition of WSi$_x$ onto the substrate.

It is also preferred to heat the substrate to a temperature of at least 500° C., more preferably to a temperature from about 550° C. to about 700° C., and most preferably to a temperature of about 625° C. The higher processing temperatures can provide more uniform films.

BRIEF DESCRIPTION OF THE DRAWINGS

These and other feature, aspects, and advantages of the present invention will become better understood with reference to the following description, appended claims, and accompanying drawings where:

FIG. 1a is a schematic view of a chemical vapor deposition apparatus suitable for preparing the WSi$_x$ films of the present invention;

FIG. 1b is a schematic view of another version of the mixing assembly 16 of FIG. 1a;

DESCRIPTION

Figure 2:
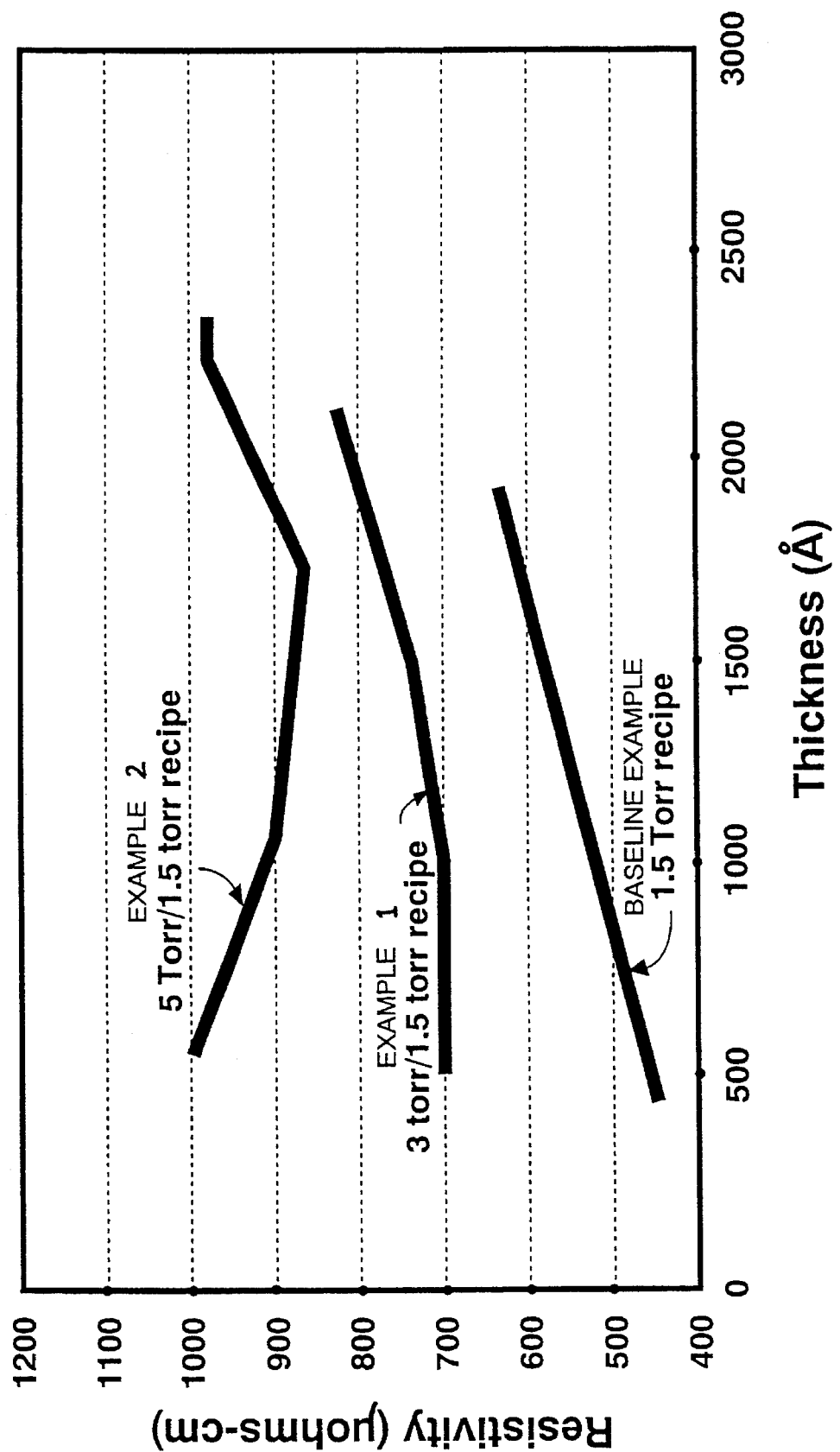
FIGS. 2 and 3 graphically present resistivity of various WSi$_x$ films, varying with depth into the film.

The present invention is directed to WSi$_x$ films with a value of x that is substantially uniform through the thickness of the film, and which contain less than $10^{18}$ fluorine atoms/cc, and more preferably less than $10^{17}$ fluorine atoms/cc. By "substantially uniform" it is meant that the average value of x within each strata of the WSi$_x$ layer is between ±10% of the average bulk value of x through the thickness of the WSi$_x$ layer. Typically, the bulk value of x is from about 2.0 to about 2.8, and preferably the value of x is from about 2.2 to about 2.6. The substantially uniform WSi$_x$ film is deposited on substrates using chemical vapor deposition processes.

Substrates

The WSi$_x$ film can be deposited on a wide variety of substrates including glasses, plastics, metals, and semiconducting wafer substrates, including, for example, silicon and gallium arsenide wafers. Moreover, the WSi$_x$ layer can be deposited on top of other layers such as a layer of Si$_3$N$_4$, polysilicon, thermally oxidized SiO$_2$, or a combination of these layers. Also, additional layers can be deposited on the WSi$_x$ film.

Deposition Chamber

The chemical vapor deposition chamber used to deposit the substantially uniform WSi$_x$ film is preferably conventional low pressure CVD equipment such as those sold by Applied Materials of Santa Clara, Calif., and described in T. E. Clark, et. al., Tungsten And Other Advanced Metals for VLSI/ULSI Applications V, Edited by S. S. Wong and S. Furukawa, (Mat. Res. Soc. Proc., Pittsburgh, Pa. 1990) page 167.

With reference to FIG. 1a, an apparatus suitable for preparing films according to the present invention comprises a deposition chamber 12, an exhaust system 14, and a gas combining or mixing assembly 16. A substrate 20, such as a silicon based semiconductor wafer, horizontally rests on top of a support or susceptor 24. A heater 26 lies directly beneath the support 24 and is used to heat the substrate 20. A deposition or reaction zone 28 lies directly above the substrate The process gases used in the CVD process enter the deposition chamber 12 through gas inlets 30, which lead into a "showerhead" type diffuser 32. The diffuser 32 uniformly distributes the process gas in the deposition zone 28. A gas combining or mixing assembly 16 mixes or combines the process gases upstream of the showerhead 32, so that the gases are substantially uniformly mixed when introduced into the deposition zone 28.

The exhaust system 14 is connected to the chamber through an exhaust line 40. The exhaust system 14 typically comprises a rotary vane vacuum pump (not shown) capable of achieving a minimum vacuum of about 10 mTorr, and optionally can include scrubber systems for scrubbing by-product gases. The pressure in the chamber 12 is sensed at the side of the substrate 20, and is controlled by adjusting a throttle valve 42 in the exhaust line 40.

Process Gases

Preferably, the process gas comprises dichlorosilane (DCS) and tungsten hexa-fluoride ($WF_6$). A seeding or nucleation gas such as $SiH_4$ or $H_2$, can be added to the process gas, for initiating deposition of a uniform layer of $WSi_x$ on the substrate, and the process gas can also contain a carrier gas, such as argon or helium.

The $WF_6$ and the DCS are transported through the feedlines 50 and 52, respectively. Mass flow controllers 54a and 54b and air operated valves 56 are used to control the flow of the reactant gases into the deposition chamber 12. The flow rates of the DCS and $WF_6$ affect the rate at which $WS_i$ film is deposited. A film deposition rate of at least 100Å per minute provides a commercially feasible production rate. Preferably, a film deposition rate above about 500Å is obtained.

The volumetric flow ratio of DCS to $WF_6$ also determine the value of x in the deposited $WSi_x$ film. As the DCS to $WF_6$ ratio increases, the amount of silicon in the $WSi_x$ layer, i.e., the value of x increases. The desired value of x (from about 2.0 to about 2.8), and the desired deposition rates can be achieved by introducing DCS into the chamber at a volumetric flow rate from about 100 to about 1000 sccm, and tungsten hexa-fluoride at a volumetric flow rate of from about 2.5 to about 20 sccm. Generally, the flow ratio of DCS to $WF_6$ is from about 5:1 to about 400:1. Optionally, argon can be added to the gas flow at a rate of from about 100 to about 1000 sccm.

Pre-Mixing

It is preferred to pre-mix or combine the dichlorosilane and tungsten hexa-fluoride upstream of the deposition zone 28 as shown in FIG. 1a. Combining the gases in a gas feedline upstream of the deposition chamber 12 results in a more uniform gas mixture being introduced into the deposition zone 28. By "upstream" it is meant before, and at a distance from, the deposition chamber 12. Preferably, the gases are combined in a feedline which is at least 2.5 inches (6.35 cms) upstream of the deposition chamber 12. It is believed that upstream pre-mixing produces a substantially more uniform initial gas mixture, thereby resulting in greater uniformity in the tungsten to silicon ratio in the "interfacial" layer of $WSi_x$ film that is first deposited on the substrate.

A preferred method for combining the DCS and $WF_6$ upstream of the deposition zone 28 utilizes a mixing/non-mixing/diverting assembly 16, as shown in FIG. 1a. The assembly 16 allows switching between a gas mixing mode, a gas non-mixing mode, and a diverting mode. In the mixing mode, the apparatus 10 can be used for processes where the process gases are mixed. In the non-mixing mode, the apparatus 10 can be used for processes where the process gases are not mixed. The assembly 16 also allows diverting of residual or contaminant process gases directly to the exhaust system 14 in the diverting mode.

With reference to FIG. 1a, the assembly 16 comprises: (i) a valve 62 in the $WF_6$ feedline 50, (ii) a valve 63 in the DCS feedline 52; (iii) a first transfer line 64 with a pair of valves 66 therein, the line 64 connecting the $WF_6$ feedline 50 to the DCS feedline 52; (iv) a second transfer line 70 with a pair of valves 72 therein, the line 70 also connecting the $WF_6$ feedline 50 to the DCS feedline 52; and (v) a mixing/diverting line 74 with a valve 76 therein, the line 74 connecting the first transfer line 64, the second transfer line 70, and the exhaust line 40.

In order to mix or combine the process gases prior to their introduction into the deposition chamber 12, the valves 62, 63, and 76 are "closed," and both of the valves as well as both of the valves 72 are "opened." This causes the $WF_6$ and DCS gases to be directed along arrows 84, thereby causing the $WF_6$ to mix with the DCS in line 74. The pre-mixed process gases then re-enter the lines 50 and 52 through the open valves 72a and 72b, and are introduced into the deposition chamber 12 through the gas inlets 30.

In the non-mixing mode, both of the valves 66 and both of the valves 72 are closed, and the valves 62 and 63 are opened. This causes the $WF_6$ and DCS, to separately flow along the pipelines 50 and 52, respectively.

In the diverting mode, both of the valves 66 and the valve 76 are opened, and the valves 62, 63 and both of the valves 72 are closed. This causes the process gases to be diverted directly to the exhaust line 40 through the diverting line 74. The diverting mode is used at the beginning of the process to divert residual process gases which remain in the feedlines 50 and 52, in order to stabilize the composition of the process gases in the feedlines 50 and 52, before premixing and introducing the process gases into the deposition chamber 12.

Another version of the assembly 16 is shown in FIG. 1b. This version does not have a diverting line and has fewer valves. To mix the gases, the valves 62 and 72 are closed, and the valve 66 is opened. This causes the $WF_6$ gas to be redirected into line 50, where the gas mixes with the DCS before being introduced into the deposition chamber 12.

Instead of using the assembly 16, it is also possible to combine the gases, by merging the pipelines 50 and 52 into a single pipeline upstream of the deposition chamber 12. Alternatively, it is also possible to mix the process gas in a mixing container.

Seeding Gas

A "seeding" or nucleation gas can be used to initiate deposition of an uniform interfacial $WSi_x$ layer. In this process, a seeding gas such as $SiH_4$ or $H_2$ is added to the process gas during the initial deposition stages for initiating deposition of an interfacial layer with a uniform Si:W ratio.

The seeding gas is added at a rate of about 10–500 sccm, and is preferably added at a rate of about 100 sccm, for a period sufficiently long that the total volume of seeding gas introduced into the deposition chamber ranges from about 1 scc to about 125 scc. The seeding gas can be added at a rate of about 10 to about 500 sccm.

Temperature

The higher the temperature in the deposition zone 28, the higher the deposition rate on the substrate 20. The minimum temperature allowing commercially feasible deposition rates is about 430° C. Lower temperatures result in rates that are too slow for commercially feasible products. The maximum temperature is determined by the maximum use temperature of the CVD equipment. It has been discovered that temperatures in excess of about 500° C. are preferred, temperatures between about 550° C. and about 700° C. more preferred, and temperatures of about 625° C. most preferred.

The deposition chamber 12 can be heated using the radiation heating lamps 26 beneath the support 24. Other conventional heating apparatus can be used.

The temperature of the substrate 20 referred to herein is the temperature of the support 24, which is measured with a thermocouple, since it is impractical to measure the temperature of the substrate 20 itself. Accordingly, all temperatures referred to herein are temperatures at which the support 24 is maintained. Typically, the temperature of the support 24 is about 20° C. to about 100° C. higher than the temperature of the substrate 20.

Pressure

The pressure in the deposition chamber 12 is maintained at at least 0.5 Torr and preferably from about 1 Torr to about 20 Torr. If the pressure is over 20 Torr, delamination between the $WSi_x$ film and the underlying substrate can occur. If the pressure is less than about 0.5 Torr, the same deficiencies as those observed in the prior art films, namely a non-uniform interface between the $WSi_x$ film and the substrate 20, is observed.

A multiple-stage pressure process, typically a two-stage pressure process, or a single-stage pressure process can be used. These processes are described below.

Two-Stage Process

When the deposition chamber 12 contains impurities, such as residual silicon containing deposits, it is preferred to use a two-stage process. The two-stage process comprises a high pressure first stage, followed by a low pressure second stage. It is believed that by operating initially at a higher pressure, the tendency of contamination to cause deposition of $WSi_x$ strata with a silicon to tungsten ratio lower than desired is overcome. The process is not limited to use of two distinct pressures, but rather, multiple pressures can be used.

In the two-stage process, the first higher pressure is at least 1 Torr, to compensate for effects that tend to lower the Si/W ratio, and the second lower pressure is at least 0.5 Torr less than the first higher pressure, i.e., for a first higher pressure of 1 Torr, the lower second pressure would be less than 0.5 Torr. Similarly, if the first higher pressure is about 2 Torr, the second pressure would be less than about 1.5 Torr.

Generally, the first stage can last from about 10 seconds to about two minutes, and the second stage from about 30 seconds to about 5 minutes. The change in pressure from the first higher pressure to the second lower pressure occurs over a finite period of time, i.e., the change of pressure is not a step change.

The composition of the process gas can be changed during the deposition process. As the pressure is reduced, the reaction efficiency of DCS decreases. This can require the flow ratio of DCS to $WF_6$ to be increased. For example, when the first stage process is 10 Torr, the flow ratio of DCS to $WF_6$ would be about 25:1, and when the pressure is reduced to 1 Torr for the second stage, the ratio is about 37.5:1. However, it is not always necessary to change the flow ratio.

Preferably the temperature in the deposition chamber 12 is maintained substantially the same during both stages, and preferably, in the two-stage process, the support 24 is heated to a temperature of about 550° C.

Single-Stage Process

Rather than varying the pressure, it is also possible to obtain a substantially uniform $WSi_x$ layer by starting off with a cleaned and conditioned deposition chamber 12, and depositing the $WSi_x$ layer in a single-stage high pressure process, in which the chamber 12 is maintained at a pressure of at least about 0.5 Torr, preferably at least about 1 Torr, and most preferably from about 1 Torr to about 20 Torr, and the support 24 maintained at a temperature of at least about 550° C.

To clean the chamber 12, $NF_3$ gas is introduced into the chamber 12, and a plasma generated. The plasma activated $NF_3$ reacts with silicon containing deposits in the chamber such as deposits on the wall, to form gaseous silicon-fluoride compounds. The silicon-fluoride compounds are removed from the chamber 12, thereby substantially cleansing the chamber of silicon containing compounds. The plasma can be generated with RF energy and maintained at a power level of about 30 to 300 Watts, for about 10 to about 40 seconds per wafer processed in the chamber, to achieve adequate vaporization of the silicon containing compounds.

Any residual fluorine ions in the chamber 12 can be removed by passivating the fluorine ions with a reactive hydrogen containing gas such as hydrogen. Residual fluorine can be passivated by generating a plasma in the chamber which causes hydrogen ions from the reactive hydrogen containing gas, to react with substantially all of the unreacted residual fluorine atoms. Alternatively, monosilane can also be used to passivate the residual fluorine.

In the single-stage process, the first wafer produced immediately after the deposition zone 28 in the chamber 12 is conditioned, is usually unsatisfactory. The next twenty-five wafers produced are satisfactory. After processing of about twenty-five wafers, it is believed that the chamber 12 should be re-conditioned.

EXAMPLES

The following examples demonstrate the effectiveness of processes according to the present invention. In these examples, a single-wafer process chamber, namely a "Precision 5000" low pressure CVD equipment as sold by Applied Materials, Santa Clara, Calif., and described in Clark, et al., supra, was used to deposit $WSi_x$ layer on a silicon wafer with a thermal oxide layer. The silicon wafer had a thickness of about 0.73 mm and a diameter of either about 150 or about 200 mm, and was loaded using a mechanical arm into the deposition chamber 12 from a load lock area (not shown) maintained at a pressure of 7 Torr of nitrogen.

The wafer 20 was introduced into the deposition chamber 12 at room temperature, and placed on a radiatively heated support 24. The wafer 20 typically equilibrated within 60 seconds and was at a temperature of about 20° to 100° C. lower than the support 24 temperature. When the wafer 20 achieved equilibrium temperature, the pressure in chamber 12 was established using a flow of non-reactive gases through pipelines 50 and 52, and the pressure controlled by the throttle valve 42 on the exhaust line 40. Process gases which include DCS and $WF_6$, were then introduced into the chamber at the required flow rate through the showerhead diffuser

Annealing

After the $WSi_x$ layer was deposited, in some tests, the wafer was then annealed in flowing nitrogen at 900° C. for 30 minutes.

Characterization Procedure

The following techniques were used to characterize the $WSi_x$ films:

depth into the film. For comparison purposes, FIG. 2 also presents the linear resistivity of a baseline film prepared by a single pressure process of 1.5 Torr and 550° C. for 80 seconds, using a $WF_6$ flow of 3.5 sccm, a DCS flow of 150 sccm, and an Argon flow of 500 sccm. It is seen from FIG. 2 that as the initial or first higher pressure increases from 1.5 Torr (in the single pressure baseline process) to 3 Torr (Example 1) and 5 Torr (Example 2), the resistivity of the interfacial regions of the films increases from about 400 $\mu\Omega$/cm to about 1000 $\mu\Omega$/cm. The higher resistivity indicates that the Si:W ratio in the interface is in the optimal range of from about 2.2:1 to about 2.6:1.

TABLE I

|  | EXAMPLE 1 | | EXAMPLE 2 | | EXAMPLE 3 | | EXAMPLE 4 | |
| --- | --- | --- | --- | --- | --- | --- | --- | --- |
|  | FIRST STAGE | SECOND STAGE | FIRST STAGE | SECOND STAGE | FIRST STAGE | SECOND STAGE | FIRST STAGE | SECOND STAGE |
| TIME (seconds) | 20 | 60 | 20 | 60 | 20 | 60 | 30 | 90 |
| PRESSURE (Torr) | 3.0 | 1.5 | 5.0 | 1.5 | 3.0 | 1.0 | 10 | 1.0 |
| $WF_6$ (sccm) | 3.5 | 3.5 | 3.5 | 3.5 | 3.5 | 3.5 | 3 | 3 |
| DCS FLOW (sccm) | 150 | 150 | 150 | 150 | 150 | 150 | 200 | 200 |
| ARGON (sccm) | 500 | 500 | 500 | 500 | 500 | 500 | 500 | 500 |
| TEMPERATURE (°C.) | 550 | 550 | 550 | 550 | 550 | 550 | 510 | 510 |

(1) The compositional variation of the tungsten to silicon ratio through the thickness of the deposited $WSi_x$ film was determined by Rutherford Backscatting Spectrometry (RBS) using a 2.275 Mev helium ion beam.

(2) The presence of impurities such as chlorine, fluorine, oxygen and carbon in the deposited film was detected by secondary ion mass spectrometry (SIMS), in a Cameca IMS4F system using a 14.5 KeV cesium ion beam. Ion implanted standards with known quantities of impurities were used to quantify the impurity levels in the SIMS profiles.

(3) The resistivity of the deposited film was measured on a "PROMETRIX RS-35" machine purchased from Prometrix, Santa Clara, Calif.

Examples 1–4: Multiple Stage Process

Examples 1–4 demonstrate that a two-stage pressure process, with a first higher pressure and a second lower pressure, produces substantially uniform $WSi_x$ films with a Si:W ratio in the interfacial region of the film in the optimal range of 2.0 to 2.8.

Table I identifies the process conditions used at each stage of the two-stage processes of Examples 1–4. Examples 1–3 provided satisfactory films and Example 4 provided an unsatisfactory film. In all the examples, a silicon wafer with a thermal oxide layer was used for the substrate 20, and the gap between the showerhead 32 and the wafer 20 was set at 0.45 inches. Examples 1 and 2 used a 150 mm diameter wafer, and Examples 3 and 4 used a 200 mm wafer.

The films of Examples 1 and 2, were processed using first higher pressures of 3 Torr and 5 Torr, respectively. FIG. 2 presents the linear resistivities of these films varying with Thus, a two-stage process with a first higher pressure and a second lower pressure, produces a $WSi_x$ film with a desirable Si:W ratio.

Figure 3:
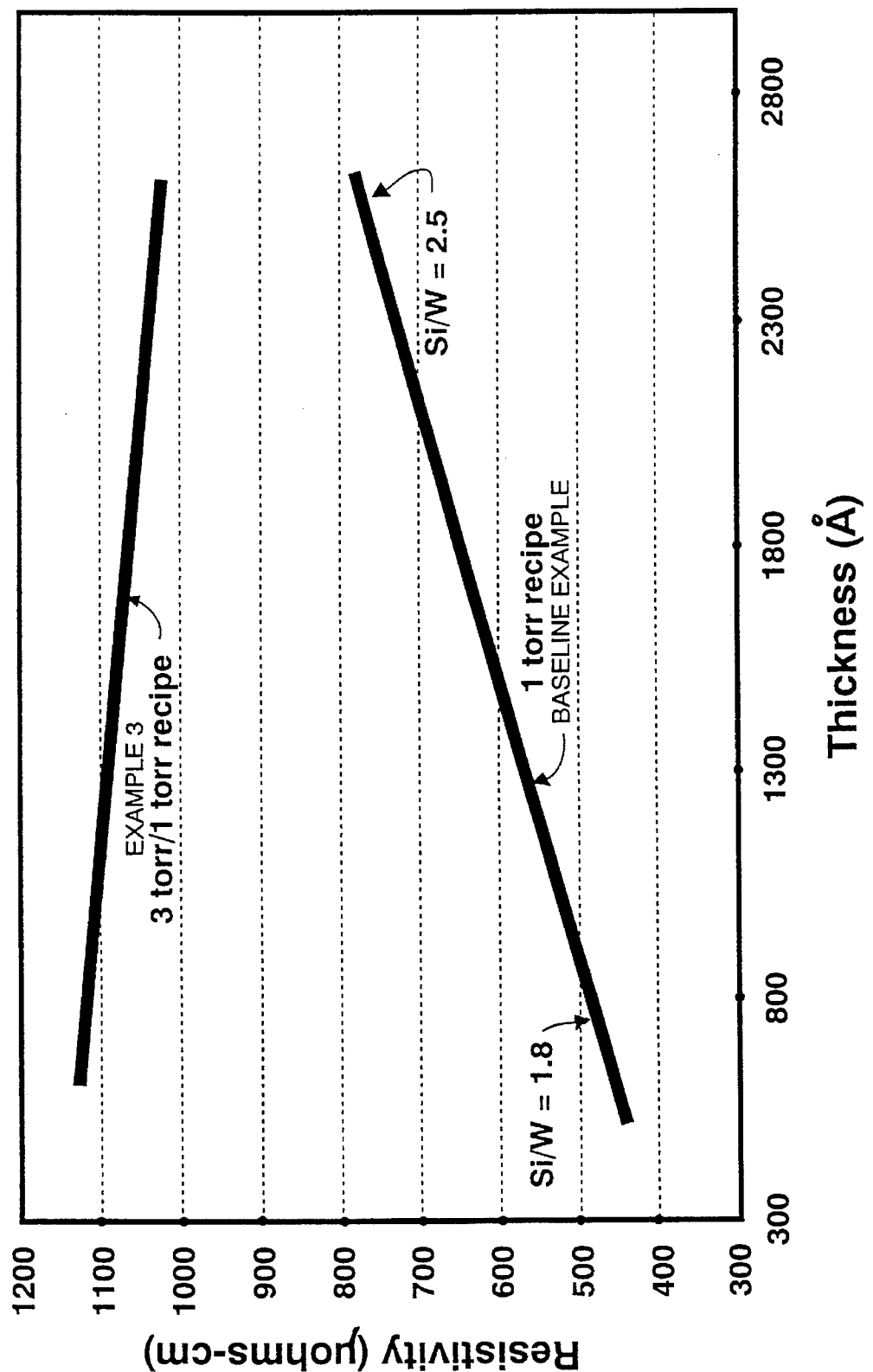

The linear resistivity of the film of Example 3 is presented in FIG. 3. For comparison purposes, the resistivity of a baseline film prepared by a single pressure process of 1 Torr and 550° C. for 80 seconds, using a $WF_6$ flow of 3.5 sccm, a DCS flow of 150 sccm, and an Argon flow of 500 sccm, is also presented in FIG. 3. The film of Example 3, processed at a first higher pressure of 3 Torr, shows a resistivity of 1100 $\mu\Omega$/cm at the interfacial region, indicating that the Si:W ratio in the interface is above 2.0. In contrast the resistivity of the baseline film at 400 $\mu\Omega$/cm indicates an undesirable Si:W ratio at the interface, which was determined by RBS spectroscopy to be about 1.8.

The film of Example 4 provided unsatisfactory results indicating that a two-stage process with a first higher pressure of 10 Torr and a second lower pressure of 1 Torr is not suitable. The Si:W ratio in the film was determined by RBS spectroscopy to be 5.4:1 in the first 1/6 th of the film, 4:1 in the next 1/6 th, and 2.6:1 in the last 2/3rds of the film. The high Si content in the interface was undesirable for the reasons provided above.

Examples 5–13: Single Stage Process

Table II presents the results of experiments which used a single-stage pressure process. These experiments reveal that substantially uniform and substantially fluorine-free $WSi_x$ layers can be deposited on substrates by maintaining the chamber pressure at at least 0.5 Torr, preferably at least about 1 Torr, and by heating the support to a temperature of at least 550° C. It is preferred to clean the deposition chamber after the processing of every 25 or more wafers.

TABLE II

| Example No. | 5 | 6 | 7 | 8 | 9 | 10 | 11 | 12 | 13 |
|---|---|---|---|---|---|---|---|---|---|
| Support Temperature (°C.) | 550 | 600 | 600 | 600 | 550 | 550 | 510 | 510 | 510 |
| Pressure (Torr) | 1 | 0.5 | 1 | 0.5 | 1 | 0.5 | 1 | 10 | 10 |
| DCS (sccm) | 150 | 150 | 150 | 150 | 150 | 150 | 200 | 200 | 200 |
| $WF_6$ (sccm) | 4 | 4 | 5 | 4 | 4 | 3 | 3 | 3 | 3 |
| Film Thickness (Å) | 2250 | 1930 | 2770 | 2210 | 2600 | 1660 | — | 3180 | — |
| Annealed | yes | yes | no | no | no | no | no | no | yes |
| Si:W ratio[1] | 2.07–2.19 | 2.17–2.32 | 2.41–2.48 | 2.2–2.55 | 2.34–2.40 | 2.48–2.70 | 1.95–3.15 | 3.3–4.3 | 3.3–2.5[2] |
| Si:W ratio (average) | 2.17 | 2.27 | 2.46 | 2.4 | 2.36 | 2.59 | — | — | — |

[1]First number represents value for ⅓ of layer closest to the interface, and the second number represents value for remainder of the layer (except for Example 13 as noted below).
[2]Three different regions were present with the first ⅙ being at 3.3, a transition ⅙ at 4.7, and the remaining ⅔ at 2.5.

Examples 5–10 provided $WSi_x$ films having satisfactory Si:W ratios from about 2.0 to about 2.8. Comparison of the films of Example 6 and 7, and comparison of the films of Examples 8 and 9, show that increasing pressure reduces the variability of the Si:W ratio of the film. Example 6 processed at 1 Torr shows a Si:W ratio of 2.41 to 2.48, while Example 7 processed at a lower pressure of 0.5 Torr shows a larger Si:W ratio variation of 2.2 to 2.55. Similarly, Example 9 run at a higher pressure of 1 Torr shows a lower Si:W ratio variation than Example 8 which was run at the lower pressure of 0.5 Torr.

Examples 11–13 provide results of unsatisfactory experiments run at temperatures of about 510° C. Examples 11 and 12 show that non-uniform Si:W ratios are obtained for films deposited at 510° C./1 Torr and 510° C./10 Torr, respectively. Example 12 shows that a pressure of 10 Torr increases the value of x above the desirable range of 2.0 to 2.8. Example 13 shows the adverse effect of annealing Example 12. It is believed that the annealing step in Example 13 causes Si migration resulting in a non-uniform $WSi_x$ film.

Figure 4:
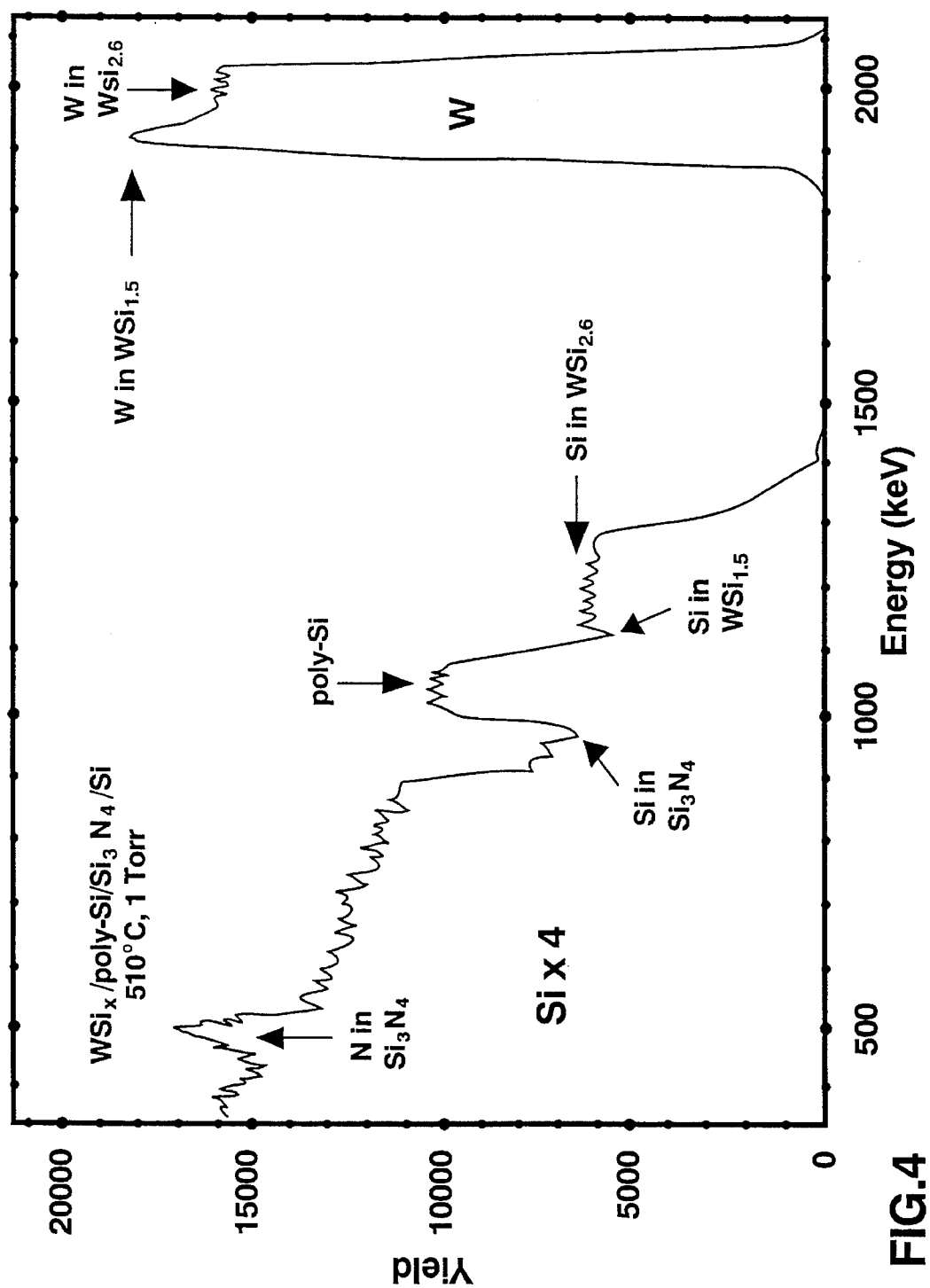
FIGS. 4 and 5 present RBS spectrum of a WSi$_x$ film with an unsatisfactory Si:W ratio in the interfacial region of the film, before and after annealing, respectively.
Figure 5:
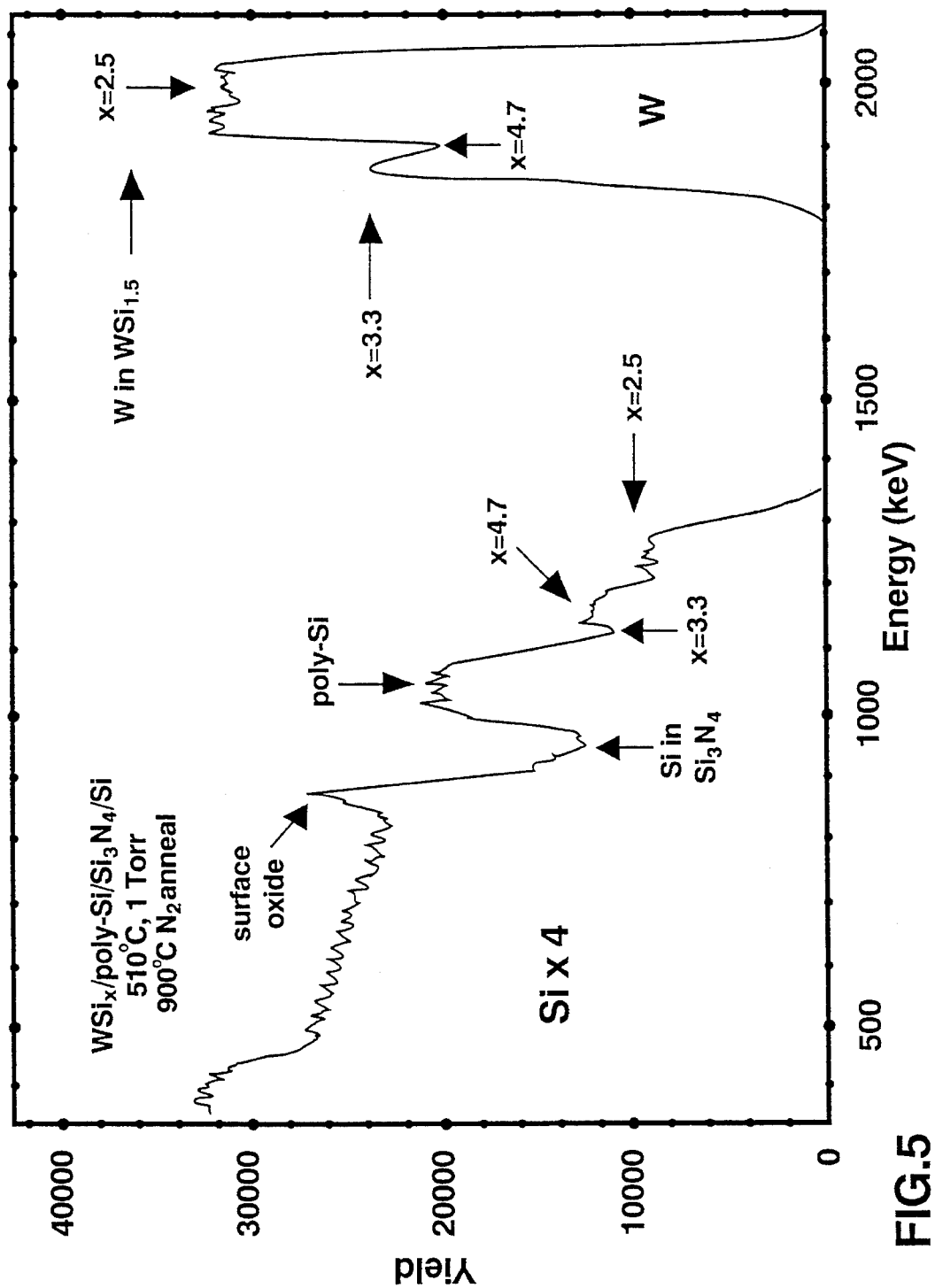

FIGS. 4 and 5 show that annealing of an unsatisfactory $WSi_x$ film which has a Si:W ratio below 2.0 in the interfacial strata, results in migration of silicon to the interface during the annealing process. The silicon migration is undesirable because it can result in the film delaminating from the substrate. The 2000 KeV peak in FIG. 4 shows that the interfacial region of the $WSi_x$ film has a Si:W ratio of about 1.5, i.e., below the desirable range of 2.0 to 2.8. FIG. 5 shows the RBS spectra of the same film, after the film was annealed in nitrogen at 900° C. for 30 minutes. The 2000 KeV peak of FIG. 5 shows that the value of x in the interface increased to about 3.3, indicating that silicon migrated to the interface during the annealing step. It is believed that this high silicon ratio at the interface causes delamination of the film.

Figure 6:
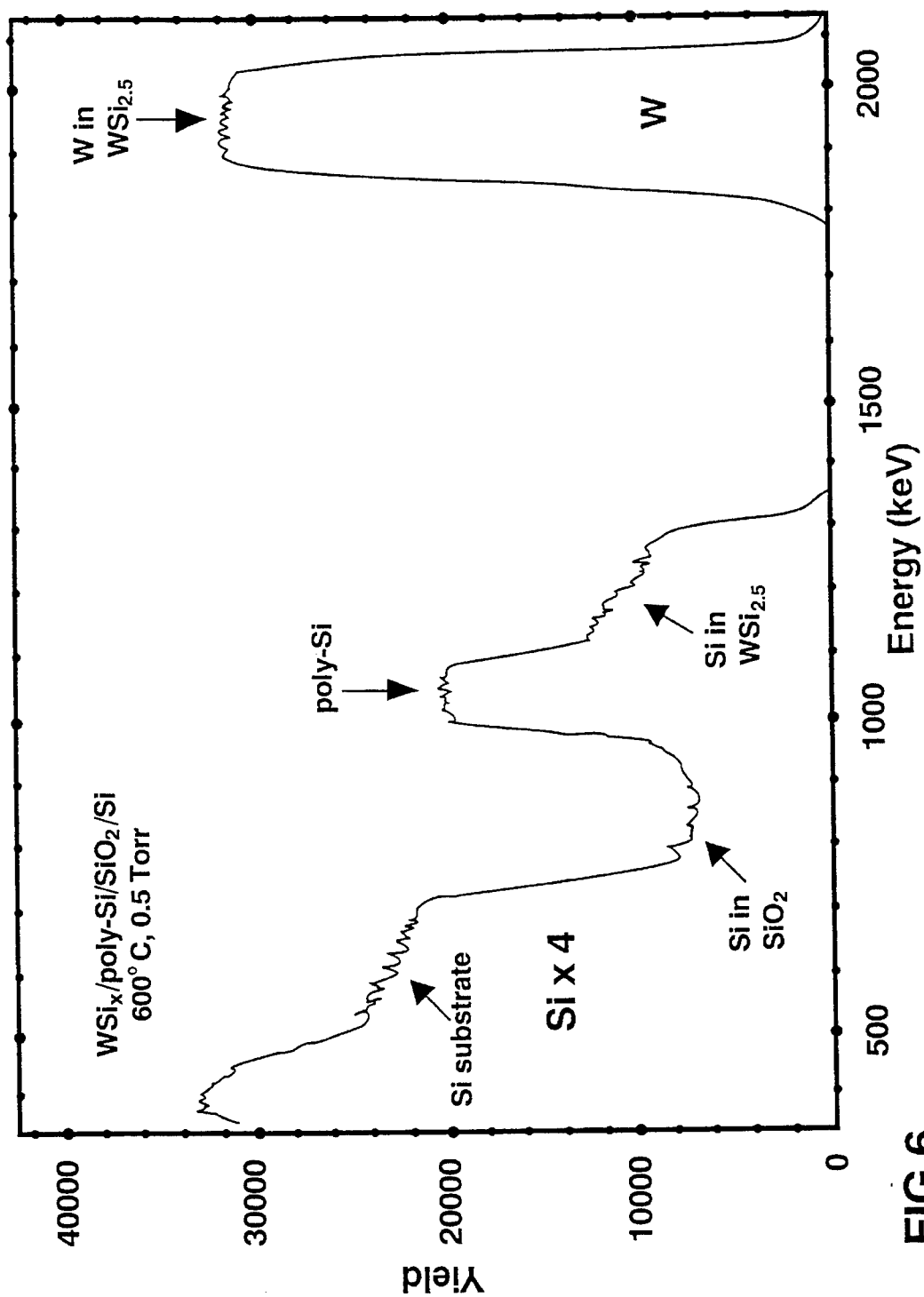
FIGS. 6 and 7 present RBS spectrum of a satisfactory WSi$_x$ film produced by a process according to the present invention, before and after annealing, respectively.
Figure 7:
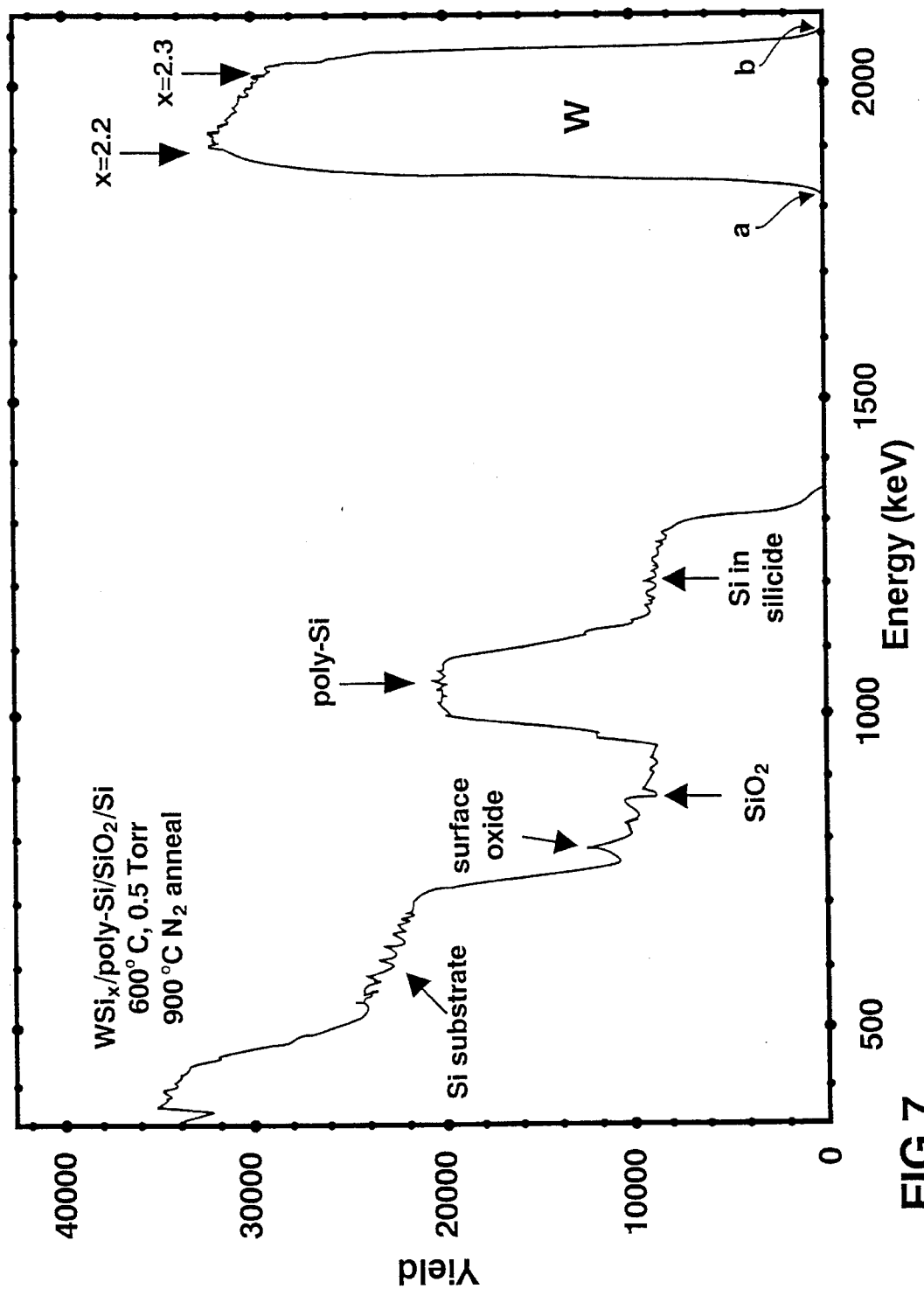

FIGS. 6 and 7 show that $WSi_x$ films with interfacial Si:W ratios from about 2.0 to about 2.6, do not result in migration of silicon during annealing. The 2000 KeV peak in FIG. 6, shows that the interfacial $WSi_x$ layer has a value of x of about 2.5. FIG. 7 shows an RBS spectrum of the film of FIG. 6, after the film was annealed in nitrogen at 900° C. for 30 minutes. With reference to the peak between the points a and b in FIG. 7, the Si:W ratio at the interface of the $WSi_x$ film is about 2.2, and in the bulk of the film is about 2.3, indicating that silicon did not migrate to the interfacial region during annealing. Also, the value of x in the bulk of the film changes only about 0.1 from the value of x in the interface, indicating that the variability of x between the interfacial strata of the film and the bulk of the film is only about ±5%. Such a variability is preferred and does not cause delamination of the $WSi_x$ layer.

Figure 8:
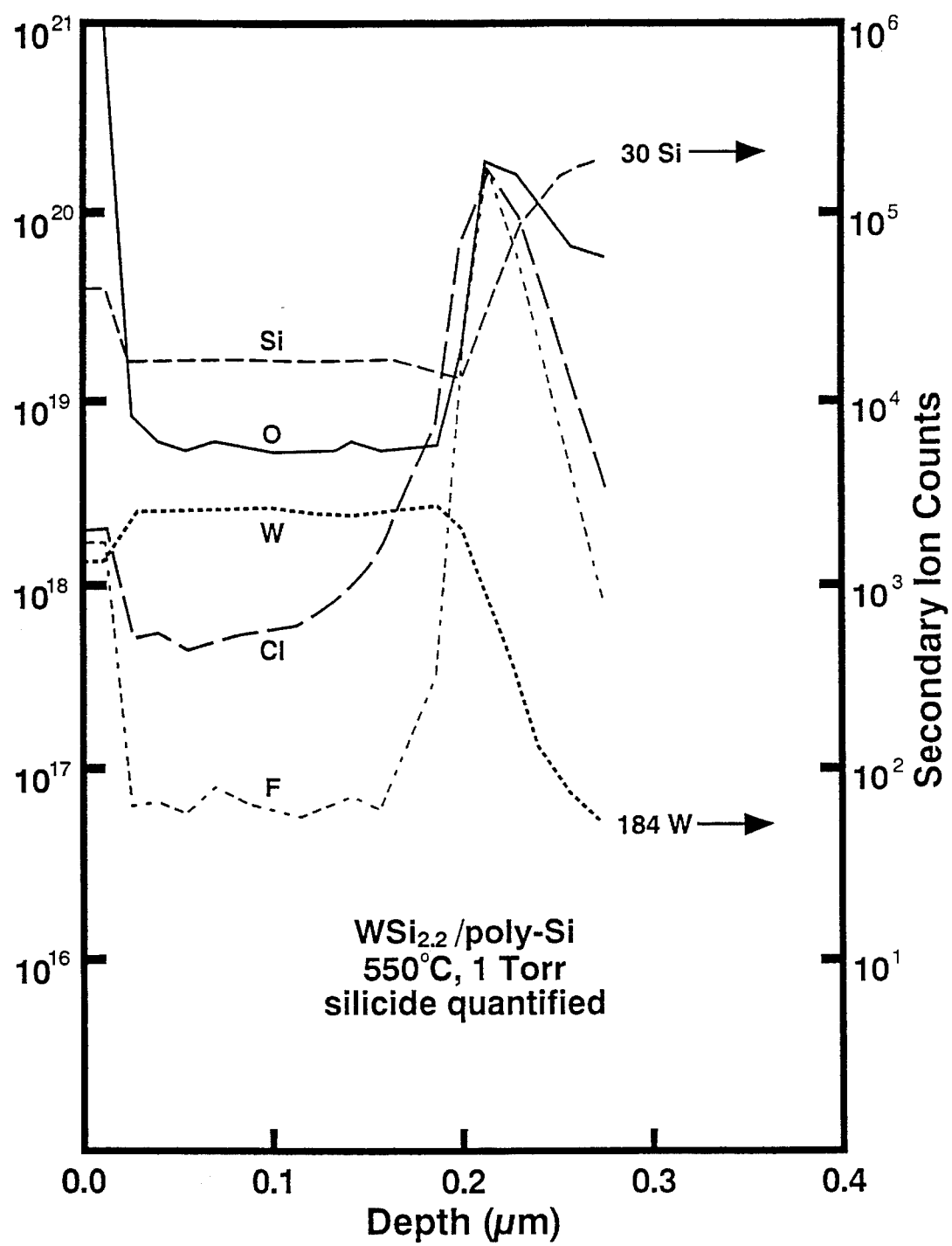
FIG. 8 presents a SIMS spectrum for a WSi$_x$ film produced by a process according to the present invention, showing the low fluorine impurity content in the film.

FIG. 8 shows that a $WSi_x$ film produced by a process of the present invention has an average fluorine content of about $7 \times 10^{16}$ atoms/cc, i.e., less than about $10^{17}$ atoms/cc. The average bulk value of x in this film was determined by RBS spectra to be about 2.5. This illustrates the low fluorine impurity content of the $WSi_x$ films of the present invention.

Example 14: Upstream Mixing

A uniform tungsten silicide film was deposited on the wafer 20 using the following process conditions. The pressure was maintained at 5 Torr, and the temperature of the substrate 20 maintained between 450°–700° C. The flow rate of $WF_6$ was 10 sccm, and the flow rate of $SiH_2Cl_2$ was 500 sccm.

The two gases were mixed in the mixing assembly 16 shown in FIG. 1b. This version of the assembly 16 did not include a diverting line. The process gases were mixed by closing the valves 62 and 72, and opening the valve 66. This caused the $WF_6$ to be redirected from feedline 50 into feedline 52, thereby combining the two gases in the feedline 52. The combined gases entered the deposition chamber 12 though a single gas inlet 30, to deposit a uniform $WSi_x$ film on the substrate.

The films and process of the present invention have significant advantages. Because of the substantially constant Si:W ratios through the thickness of the films, and because of their low fluorine content, the films do not tend to delaminate from the underlying substrate. Thus, it is expected that fewer defective integrated circuits will be built, and the cost of integrated circuits will be lowered. Moreover, the films can be deposited using existing conventional equipment. Therefore, investments in expensive chemical vapor deposition equipment are not required.

Although the present invention has been described in considerable detail with regard to the preferred versions thereof, other versions are possible. For example, although a two-stage process is claimed and described, the process may be a multi-stage process having more than two stages. Also, the process of pre-mixing the process gas upstream of the deposition chamber can be used with prior art CVD processes, and is not limited to use with the multi-stage and single-stage processes of the present invention. Therefore, the appended claims should not be limited to the descriptions of the preferred versions contained herein.

What is claimed:

1. A chemical vapor deposition process for depositing a substantially uniform, substantially fluorine free layer of $WSi_x$ on a substrate, the process comprising the steps of:
   (a) placing a substrate within a deposition zone;
   (b) during an initial deposition stage, (i) introducing seeding gas, dichlorosilane and tungsten hexa-fluoride into the deposition zone; and (ii) maintaining the deposition zone at process conditions suitable for depositing an interfacial layer of $WSi_x$ having a substantially uniform Si:W ratio directly on the substrate; and (c) during a second deposition stage, (i) stopping flow of the seeding gas, while continuing to flow dichlorosilane and tungsten hexa-fluoride into the deposition zone; and (ii) maintaining the deposition zone at process conditions suitable for depositing a substantially uniform $WSi_x$ layer on the interfacial $WSi_x$ layer.

2. The process of claim 1 wherein in step (b) the seeding gas is selected from the group consisting of $SiH_4$ and $H_2$.

3. The process of claim 1 wherein in step (b) the volumetric flow rate of the seeding gas ranges from about 10 to about 500 sccm.

4. The process of claim 1 wherein in step (b) the total volume of seeding gas introduced into the deposition zone during the initial deposition stages ranges from about 1 to about 125 scc.

5. The process of claim 1, wherein in both stages the substrate is heated to a temperature of at least 500° C.

6. The process of claim 5, wherein in both stages the substrate is heated to a temperature from about 550° C. to about 700° C.

7. The process of claim 1, wherein in both stages the pressure in the deposition zone is from about 1 Torr to about 20 Torr.

8. The process of claim 1, wherein in both stages the DCS and $WF_6$ is combined sufficiently upstream of the deposition zone that the process gas is substantially uniform when introduced into the deposition zone.

9. The process of claim 1, wherein in both stages the volumetric flow ratio of DCS to $WF_6$ is from about 5:1 to about 400:1.

10. The process of claim 1 wherein the substrate is selected from the group consisting of silicon, silicon oxide, and polysilicon.

11. The process of claim 1 further comprising the step of annealing the $WSi_x$ layer on the substrate, and wherein the $WSi_x$ layer does not separate from the substrate during annealing.

* * * * *